United States Patent [19]

Williams et al.

[11] 3,854,057

[45] Dec. 10, 1974

[54] HIGH SPEED IMPEDANCE SENSITIVE SWITCH DRIVER

[75] Inventors: Heyward Sturges Williams, Amherst; Robert Robbins, Hudson, both of N.H.

[73] Assignee: LRC Corporation, Hudson, N.H.

[22] Filed: Dec. 11, 1972

[21] Appl. No.: 314,114

[52] U.S. Cl. .................. 307/255, 307/241, 307/270, 330/13, 330/17

[51] Int. Cl. .............................................. H03f 3/18

[58] Field of Search ............. 330/17, 13, 14, 15, 18; 307/270, 255, 241

[56] References Cited

UNITED STATES PATENTS

| | | | |
|---|---|---|---|
| 2,896,029 | 7/1959 | Lin | 330/13 |
| 2,955,257 | 10/1960 | Lindsay | 330/17 X |
| 2,997,606 | 4/1961 | Hamburger et al. | 307/255 X |
| 3,376,388 | 4/1968 | Reiffin | 330/13 X |
| 3,418,590 | 12/1968 | Rongen et al. | 330/14 |
| 3,434,067 | 3/1969 | Eckelmann | 330/17 X |
| 3,441,864 | 4/1969 | Hafler | 330/13 X |
| 3,537,023 | 10/1970 | Myer | 330/17 X |
| 3,562,660 | 2/1971 | Pease | 330/17 X |
| 3,619,797 | 11/1971 | Merrick | 330/17 X |
| 3,622,902 | 11/1971 | Thomas | 330/17 X |

*Primary Examiner*—Stanley D. Miller, Jr.
*Assistant Examiner*—William D. Larkins
*Attorney, Agent, or Firm*—Joseph S. Iandiorio

[57] ABSTRACT

A high speed, impedance sensitive, amplifying, switch driver including an input terminal for selectively receiving a first input signal of a first voltage accompanied by a high impedance state and a second input of a second voltage accompanied by a low impedance state; an output terminal for presenting first and second amplified switching signals corresponding to the input signals; an output stage including first and second semiconductor means each having a first load electrode connected to the output terminal for ultimately selectively producing the first and second switching signals; an intermediate switching stage including third and fourth semiconductor means each having a first load electrode connected in common to the control electrodes of the first and second semiconductor means for alternately selectively turning on one of the first and second semiconductor means and turning off the other; and in output stage including means for alternately, selectively, biasing one of the second and third semiconductor means in a low conduction state and the other in a high conduction state in response to the first and second input signals.

4 Claims, 5 Drawing Figures

HIGH SPEED IMPEDANCE SENSITIVE SWITCH DRIVER

FIELD OF INVENTION

This invention relates to a high speed, impedance sensitive, amplifying, switch driver and more particularly to such a switch driver which uses complementary voltage gain circuits.

BACKGROUND OF INVENTION

In some applications it is desirable to have a switch driver which produces a balanced or symmetrical output i.e., an output which swings as far in one direction as it does in the other from some reference level. For example, in microwave applications it is often desirable to provide switching signals which switch from one or two volts positive to one or two volts negative symmetrically about zero or ground. Also in switching applications it is desirable to minimize delay between the output and the input and to prevent accidental triggering of the circuits by noise or spurious signals at the input. In one attempt to solve this problem by the same inventors, Ser. No. 279,258, filed Aug. 9, 1972, Switch Driver, a pair of complementary transistors are driven from a voltage divider connected to the input. Any change in voltage at the input accompanied by a change of impedance causes the impedance of the voltage divider to change and switch the transistors. Since the impedance changes at a faster rate than the voltage a great increase in speed is achieved. Another problem in the switch driver art is that of producing amplification without significant loss in speed. In one approach a preliminary circuit including a transistor is used to vary the voltage across an impedance which selectively switches one or more output transistors. This approach has met with indifferent success, in part, because the preliminary circuit transistor typically operates at or near saturation in one mode where the transistor switching speed is reduced. In addition the stray capacitance associated with the circuit requires sufficient time to discharge across the impedance and so the time constant set by the combination of the impedance and that stray capacitance is imposed on the switching time.

SUMMARY OF INVENTION

It is therefore an object of this invention to provide an improved high speed, impedance sensitive, amplifying switch driver.

It is a further object of this invention to provide such an improved switch driver in which the final output signal voltage level can actually be produced before the final input signal voltage level is present.

It is a further object of this invention to provide such an improved switch driver in which the output voltage is greater than the input voltage and symmetrical about a reference level.

The invention resulted from the realization that by using a second pair of complementary semiconductor means operated in their linear range, so that one is always conducting a little and the other a lot and even in heavy conduction neither semiconductor means reaches a saturation condition, and so that whichever one is conducting more heavily functions to dissipate stray capacitance associated with either, then the high speed impedance change occuring at the input can be reflected by this second pair of semiconductor means through the first pair to the output so quickly that a final output signal voltage level is produced before the final input signal voltage level is present.

The invention features a high speed, impedance sensitive, amplifying, switch driver including an input terminal for selectively receiving a first input signal of a first voltage accompanied by a high impedance state and a second input signal of a second voltage accompanied by a low impedance state. An output terminal is provided for presenting first and second high speed amplified switching signals corresponding to the input signals. The output stage includes first and second semiconductor means each having a first load electrode connected to the output terminal for alternately, selectively, producing the first and second switching signals. An intermediate switching stage includes third and fourth semiconductor means each having a first load electrode connected in common to the control electrodes of the first and second semiconductor means, for alternately, selectively, turning on one of the first and second semiconductor means and turning off the other. An input stage includes means for alternately, selectively, biasing one of the third and fourth semiconductor means in a low conduction state and the other in a high conduction state in response to the first and second input signals.

DISCLOSURE OF PREFERRED EMBODIMENT

Other objects, features and advantages will occur from the following description of a preferred embodiment and the accompanying drawings, in which.

Figure 1:
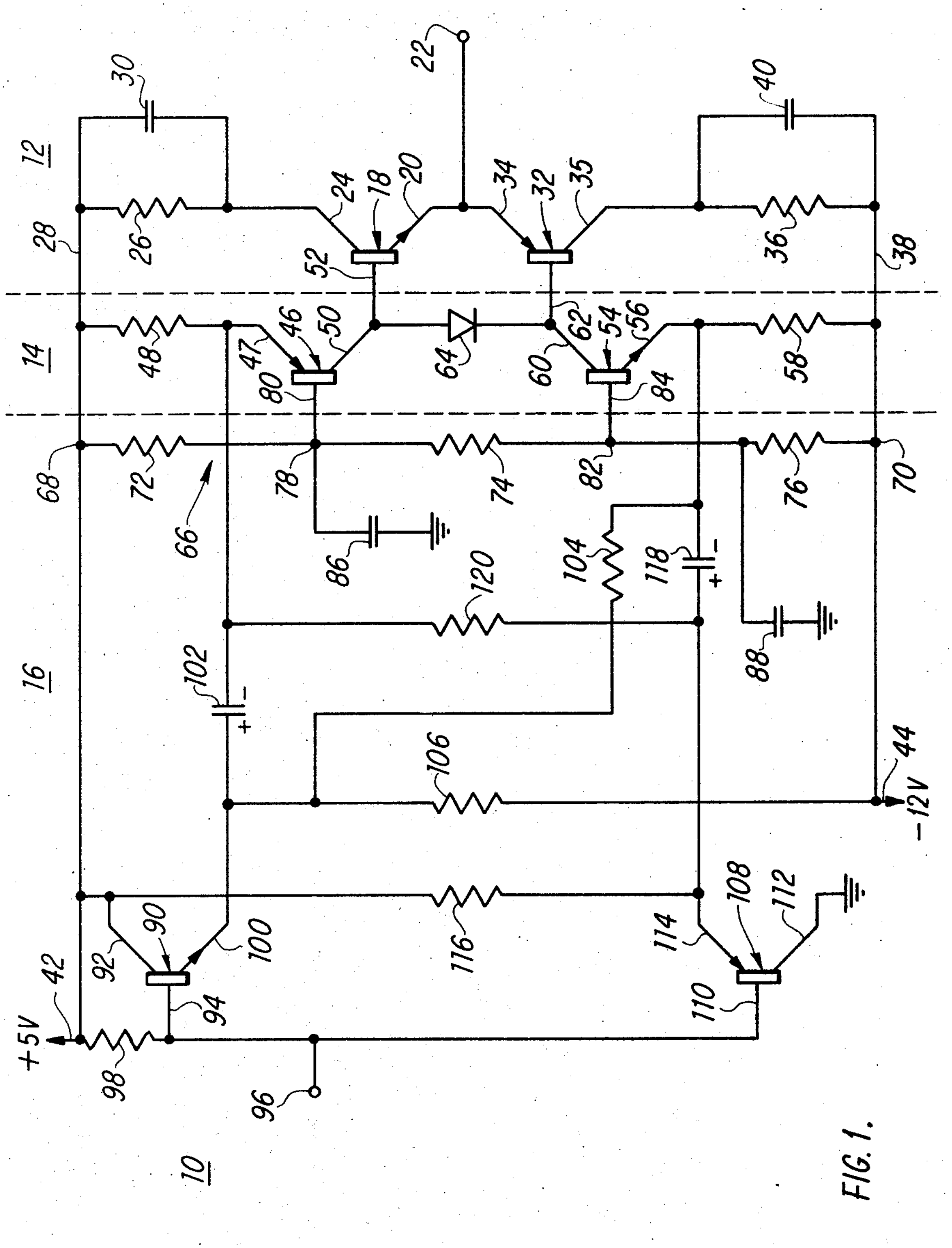
FIG. 1 is a schematic diagram of a noninverting, high speed, impedance sensitive, amplifying, switch driver according to this invention for use with a power supply voltage which is close to that of an input signal.

There is shown in FIG. 1 a high speed, impedance sensitive, amplifying, switch driver 10 including three stages: an output stage 12, an intermediate stage 14, and an input stage 16. In the description of FIG. 1 specific values are given for all resistors and capacitors and each transistor and diode is identified. This is done to better enable one to understand the invention and these specific identifications are not a limitation on the invention. Output stage 12 includes a 2N2369A transistor 18 having its emitter 20 connected to the output 22 and collector 24 connected through a 130 ohm resistor 26 to the positive power bus 28 a 1,000 pf capacitor 30 may be provided across resistor 26. A second 2N4209A transistor 32 has its emitter 34 connected to output 22 and its collector 35 connected through a 360 ohm resistor 36 connected to the negative power bus 38; a 1,000 pf capacitor 40 may be provided across resistor 36. Although one end of capacitor 30 is shown connected to bus 28 it may as well be grounded as may the end of capacitor 40 which is shown connected to bus 38. Power bus 28 is adapted for connection to a positive power supply, for example +5 volts at power terminal 42 and negative power bus 38 is adapted for connection to a negative power supply, for example, −12 volts at power terminal 44.

Intermediate stage 14 includes a 2N4209A transistor 46 having its emitter 47 connected through a 100 ohm resistor 48 to power bus 28 and its collector 50 connected to the base 52 of transistor 18. A second 2N2369A transistor 54 has its emitter 56 connected through a 100 ohm resistor 58 to negative power bus 38 and its collector 60 connected to the base 62 of transistor 32. The bases 52 and 62 of transistor 18 and 32 may be connected directly together or may be interconnected through a 1N914 diode 64 which serves to compensate for a temperature drop across the base to emitter junction of whichever one of transistors 18 or 32 is on at the moment: the temperature coefficient of the voltage across diode 64 is approximately equal to the temperature coefficient of the voltage across the base to emitter junction of transistor 18 and of transistor 12.

Input stage 16 functions to maintain one of transistors 46 and 54 in a low conducting state and the other in a high conducting state so that neither is ever completely off or in a completely saturated condition. There is a voltage divider 66 having a first terminal 68 connected to positive power bus 28, a second terminal 70 connected to negative power bus 38, and three resistors: 330 ohm resistor 72; 3,000 ohm resistor 74; and 330 ohm resistor 76. A first tap 78 of voltage divider 66 is connected to the base 80 of transistor 46; the second tap 82 is connected to the base 84 of transistor 54. A 1,000 pf capacitor 86 is connected to base 80 to accelerate the switching action of transistor 46 and a 1,000 pf capacitor 88 is connected to base 84 of transistor 54 for the same reason. The other end of capacitor 86 may be connected to a level substantially below that of base 80 such as ground as shown and the other end of capacitor 88 may be connected to a level which is less negative than that of base 84 or to ground as shown.

Input stage 16 in this embodiment also includes a 2N2369A transistor 90 having its collector 92 connected directly to bus 28 and its base 94 connected directly to the input 96, of the switch driver 10. Base 94 is also interconnected with bus 28 through 3.9K ohm resistor 98. Emitter 100 of transistor 90 is connected to the emitter 47 through 100 pf capacitor 102. Emitter 100 of transistor 90 is also connected to emitter 56 of transistor 54 through 4.3K ohm resistor 104 and is connected to power bus 38 through 2K ohm resistor 106. A second 2N4209A transistor 108 also has its base 110 connected to input 96 and has its collector 112 grounded. Emitter 114 of transistor 108 is connected through a 240 ohm resistor 116 to the collector 92 of transistor 90 and bus 28. Emitter 114 of transistor 108 is also connected to the emitter 56 of transistor 54 through a 100 pf capacitor 118. The emitter 47 of transistor 46 is connected to the emitter 114 of transistor 108 through a 430 ohm resistor 120.

Switch driver 10 typically responds to an input signal which moves from a low impedance to ground forcing zero volts on the input to a high impedance which allows the switch driver to provide +5 volts at the input and back to a low impedance again alternately. In operation with 5 volts at the input 96 transistor 90 conducts heavily and its emitter 100 is at approximately +4.4 volts. Current flowing from transistor 90 charges capacitor 102 in the polarity shown in FIG. 1. Capacitor 118 is charged in the same manner with the polarity shown in FIG. 1 through resistor 116. Simultaneously current flow through resistor 104 reaches the emitter 56 circuit of transistor 54 and provides some current flow through resistor 58. Emitter 56 is at approximately −11.1. Resistor 106 is approximately half the resistance of resistor 104 so that it carries approximately twice the current that resistor 104 does in the heaviest conduction period. This is done so that the current through resistor 104 will not change substantially between the two conditions of transistor 90 i.e., the one in which it conducts heavily when there is a 5 volt signal at input 96 and the one in which it conducts only minimally when there is a zero voltage signal at input 96. The increased current through resistor 58 contributed from the transistor 90 reduces the requirement for current to resistor 58 from transistor 54; base 84 of transistor 54 is held at approximately −10.5 volts by its connection to the second tap 82 of voltage divider 66. Since transistor 54 needs to supply less current to resistor 58 there will be less current flowing through diode 64 into the collector 60 of transistor 54. Transistor 46 has its base 80 held at approximately +3.9 volts by resistor 72. Emitter 47 of transistor 46 is held at approximately +4.5 volts by resistor 48. Thus the decrease in current through collector 60 of transistor 54 results in the additional current required by the voltage drop across resistor 48 being conducted through the emitter 47 to base 80 junction of transistor 46 which results in transistor 46 being turned on to a high conduction state. In this state the voltage across emitter 47 to collector 50 of transistor 46 is two-tenths of a volt where the emitter 47 is at +4.5 volts and collector 50 is at +4.3 volts. This two-tenths of a volt drop plus the six-tenths of a volt drop from the base 52 to emitter 20 of transistor 18 sets the output 22 at a level of +3.7 volts. Since there is a similar six-tenths volt drop from collector 50 to collector 60 across diode 64 there is no drop across the emitter 34 to base 62 of transistor 32 and it is in the off state.

When the voltage at input 96 now switches from +5 volts to zero transistor 90 is caused to conduct less heavily and its emitter 100 stabilizes at −6/10 of a volt. Transistor 108 is now caused to conduct heavily; its base 110 being at zero and its emitter 114 being at +6/10 of a volt. This causes the current flowing through resistor 48 to be diverted from the emitter 47 of transistor 46 and flow instead through resistor 120 to the emitter 114 of transistor 108 and to ground through collector 112. Base 80 of transistor 46 is now at +3.5 volts and its emitter 47 at +4.1 volts. Since there is a diversion of the current from resistor 48 to transistor 108, the emitter 47 to base 80 circuit of transistor 46 is required to conduct less. Transistor 46 stabilizes at the point where there is just enough conduction at the base 80 to emitter 47 to preserve the current required by the voltage drop across resistor 48 minus the current drawn through resistor 120. This reduced current flows through diode 64 whose cathode is now at −11.6 volts and into the collector 60 of transistor 54. Since transistor 54 now receives only a small current at its collector 60 from transistor 46, added current must be drawn through base 84 into emitter 56 to supply resistor 58.

Base 84 of transistor 54 is now at −11 volts. The increased current flow from base 84 to emitter 56 of transistor 54 causes it to conduct more heavily because transistor 46 is conducting less heavily and so providing less current into collector 60 of transistor 54 for supplying resistor 58 and because transistor 90, now in the low conduction state, is delivering less current through resistor 104 to supply resistor 58. Thus transistor 54 conducts very heavily. Its collector 60 approaches −11.6 volts as does its emitter 56. This establishes the base 62 of transistor 32 more negative than its emitter 34 which is at −11 volts. The emitter 20 and the base 52 of transistor 18 are both at −11 volts because the voltage drop across diode 64 is also six-tenths of a volt. Therefore, output 22 is at −11 volts. Thus the output has moved from +3.7 volts to −11 volts as the input has swung from +5 volts to zero volts. Thus there has been provided a gain of approximately 3 and the output is symmetrical about a −3.65 voltage level. Capacitors 102, 118, 86 and 88 each operate to accelerate the switching action of transistors 46 and 54. Capacitors 102 and 118 are charged as shown with positive toward input 96 and negative toward 92. When transistor 90 switches from its highly conducting state in which there is a +5 volt signal at the input to its low conducting state in which there is a zero volt signal at the input, capacitor 102 discharges through transistor 90 and resistor 48 adding at this time to the diversion of current from emitter 47 which diversion primarily is being caused by the highly conducting state of transistor 108. This discharging action accelerates the increased conduction of transistor 46. Subsequently when a +5 volt signal on input 96 has caused transistor 90 to go into the highly conducting state, the charging of capacitor 102 slows down the rate at which current is introduced from emitter 100 to emitter 47 and so accelerates the turning off of transistor 46. Similarly with a +5 volt signal at input 96 capacitor 118 charges with the polarity as shown. Subsequently with a zero volt signal at input 96, when transistor 108 starts to conduct, capacitor 118 will discharge through transistor 108, capacitor 88, the base 84 to emitter 56 junction of transistor 54 and then through resistor 58. This discharge current accelerates the increased conduction of transistor 54. Capacitors 86 and 88 operate to delay the change in voltage at the bases 80, 84 of transistors 46, 54, respectively to further accelerate their switching action. For example, with a +5 volt signal at input 96 base 80 is at +3.9 volts, when a zero volt signal is applied at input 96 base 80 attempts to switch immediately to +3.5 volts. However, capacitor 86 slows down the decrease in voltage from +3.9 volts to +3.5 volts. However, since the voltage on emitter 47 is decreasing quickly the slowing down of the decrease of the voltage on base 80 causes the emitter voltage to approach the base voltage even more quickly and hasten the cutoff of transistor 46. Conversely, when a +5 volt signal is again applied to input 96 emitter 47 begins to move from +4.1 volts to +4.5 volts. At this time capacitor 86 holds base 80 at +3.5 volts causing emitter 47 to become more positive with respect to base 80 at an even faster rate so that transistor 46 will turn on even more quickly. Capacitor 88 operates in the same way with respect to transistor 54 as capacitor 86 does with respect to transistor 46.

Figure 2:
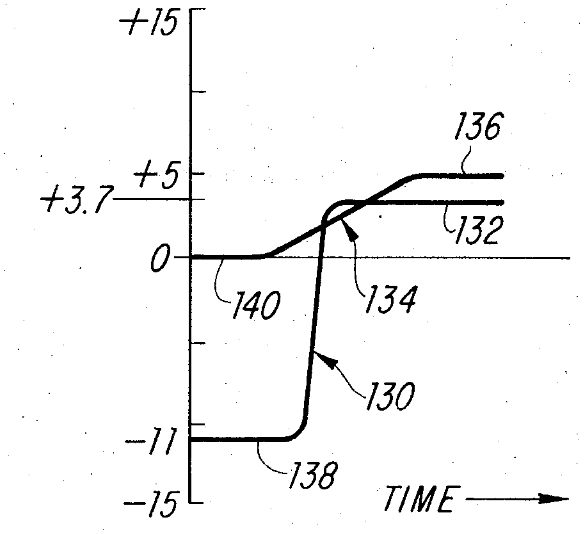
FIG. 2 is a timing diagram showing the relationship of input signal and output signal.

The complementary action of transistors 46 and 54 and their operation in a linear region enables switch driver 10 to produce an output signal 130, FIG. 2, which reaches its final positive level 132 (+3.7 volts) before the input signal 134 reaches its final positive level 136 (+5 volts) and enables the final negative level 138 (−11 volts) of output 130 to be reached before the corresponding final level 140 (0 volts) of the input signal 134 is reached. Thus time can be saved or the signal "speeded up" by action of this switch driver. This subtraction of time or negative addition of time produced by switch driver 10 is in one embodiment as much as 20 nanoseconds.

Figure 1A:
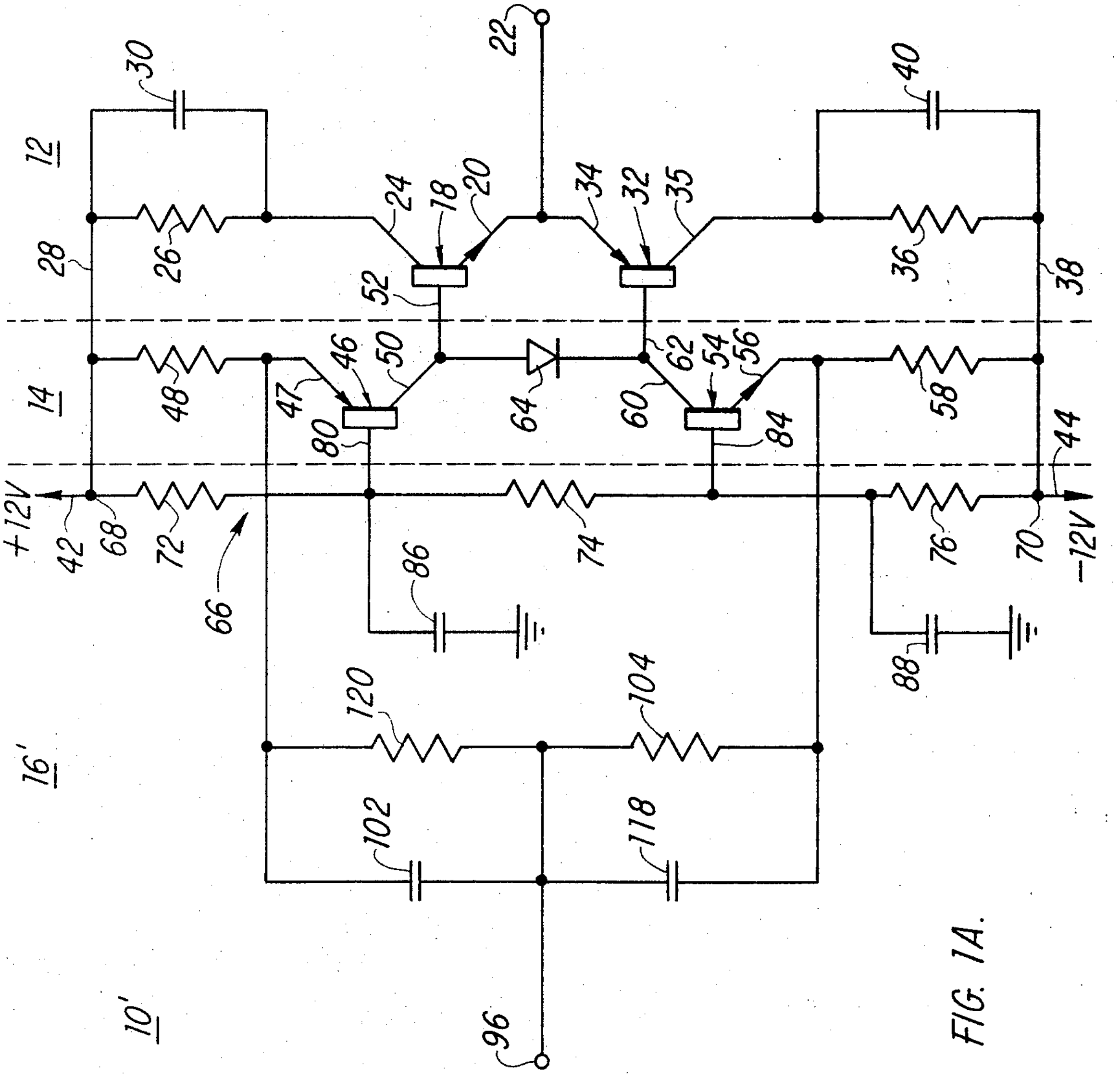
FIG. 1A is a schematic diagram similar to that shown in FIG. 1 for use with a power supply voltage substantially greater than the input signal.

If the circuit of FIG. 1 is to be used with a power supply which provides a positive 12 volt input instead of a positive 5 volt input to bus 28, transistors 90 and 108 and their associated circuitry may be eliminated and replaced with the more simple input buffering system shown in FIG. 1A where like parts have been given like numbers and similar parts similar numbers primed. Switch driver 10′, FIG. 1A, includes the same output stage 12 and intermediate stage 14 as switch driver 10, FIG. 1. However the input stage 16′ of switch driver 10′ has been modified by eliminating transistors 90 and 108 and eliminating resistors 98, 106 and 116. Switch driver 10′ is now capable of operating with a −12 volt supplied to terminal 44 and a +12 volt supplied to terminal 42 provided the values of the various resistances and capacitors are adjusted for the increased voltage. The operation is essentially the same as that of FIG. 1. A +5 volt signal at input 96 causes transistor 54 to conduct less heavily and transistor 46 to conduct more heavily turning on transistor 18 whereas a zero volt signal at input 96 causes transistor 54 to conduct more heavily and transistor 46 to conduct less heavily so that transistor 32 is turned on.

Both the embodiments shown in FIGS. 1 and 1A produce an output which is not inverted with respect to the input.

Figure 3:
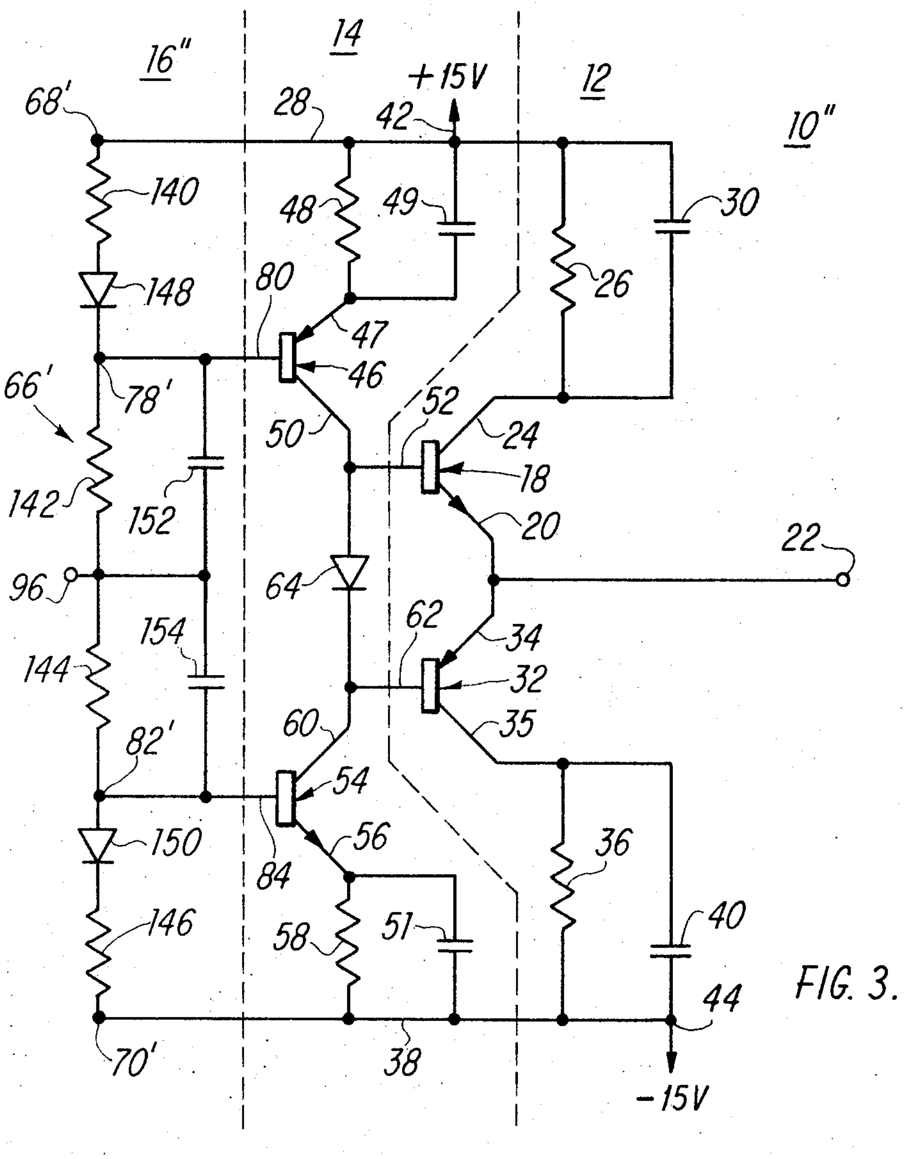
FIG. 3 is a schematic diagram of an inverting, high speed, impedance sensitive, amplifying, switch driver according to this invention.

However, if an inversion is desirable it may be obtained by using switch driver 10″, FIG. 3, wherein like parts have been given like numbers and similar parts like numbers primed with respect to FIG. 1. In switch driver 10″, FIG. 3, control signals are applied to the bases 80 and 84 of transistors 46 and 54 as contrasted with switch driver 10, FIG. 1, where the control signals were applied to the emitters 47 and 56 of transistors 46 and 54, respectively.

Stage 12 in switch driver 10″ is the same as stage 12 in switch drivers 10 and 10′. And stage 14 in switch driver 10″ is the same as stage 14 in the switch drivers 10 and 10′ with the exception that in switch driver 10″, FIG. 3, a capacitor 49 has been added across resistor 48 and a capacitor 51 has been added across resistor 58 to increase the speed of switching transistors 46 and 54, respectively. Stage 16″, FIG. 3, includes a voltage divider 66′ having first and second terminals 68′ and 70′ and first and second taps 78′ and 82′. Voltage divider 66′ includes resistors 140, 142, 144 and 146 and may also include the diodes 148 and 150 which serve to provide temperature compensation for the base to emitter junctions of transistors 46 and 54, respectively.

In operation, with a +5 volt signal at input 96, base 80 of transistor 46 is at +6.7 volts while emitter 47 is at +7.3 volts and transistor 46 is conducting the current required by the voltage across resistor 48. Simultaneously, there is a −5.6 volts at the base 84 of transistor 54 and emitter 56 is at −6.2 volts. In this condition the voltage drop across resistor 48 is less than that across resistor 58. Therefore transistor 54 must conduct more heavily than transistor 46. The difference in current required by resistors 48 and 58 is now flowing through resistor 144, base 84, and emitter 56 to resistor 58. The collector 50 of transistor 46 is thus at −6.0 volts. There is a six-tenths volt drop across the base 62 to emitter 34 of transistor 32 and also across diode 64. Therefore, transistor 18 is not conducting because there is no drop from its base 52 to its emitter 20 and the voltage at output 22 is −5.4 volts. Subsequently with a zero volt signal at input 96 there is +4.3 volts on base 80 at transistor 46 and a +4.9 volts on emitter 47 of transistor 46 which causes transistor 46 to conduct much more heavily. Meanwhile transistor 54 experiences −6.3 volts at its base 84 and +4.1 volts at its collector 60, while its emitter 56 is at −6.9 volts. The voltage drop across resistor 48 has now increased and that across resistor 58 has decreased. As transistor 46 begins to conduct more heavily the voltage on its collector 50 approaches that on its emitter 47; finally collector 50 reaches +4.7 volts turning on transistor 18 which causes a six-tenths of a volt drop across its base 52 to emitter 20 junction resulting in a +4.1 volts at the output 22. Transistor 32 is in the off condition and has a +4.1 volt level at its emitter 34 and its base 62.

Capacitors 49 and 51 act to delay the change in voltage level on emitters 47 and 56 respectively in much the same way and for the same purpose as capacitors 86 and 88 act with respect to bases 80 and 84, respectively, FIG. 1. Capacitors 152 and 154 serve to provide a quicker path between input 96 and the bases 80 and 84 of transistor 46 and 54, respectively, to hasten their switching actions.

Figure 4:
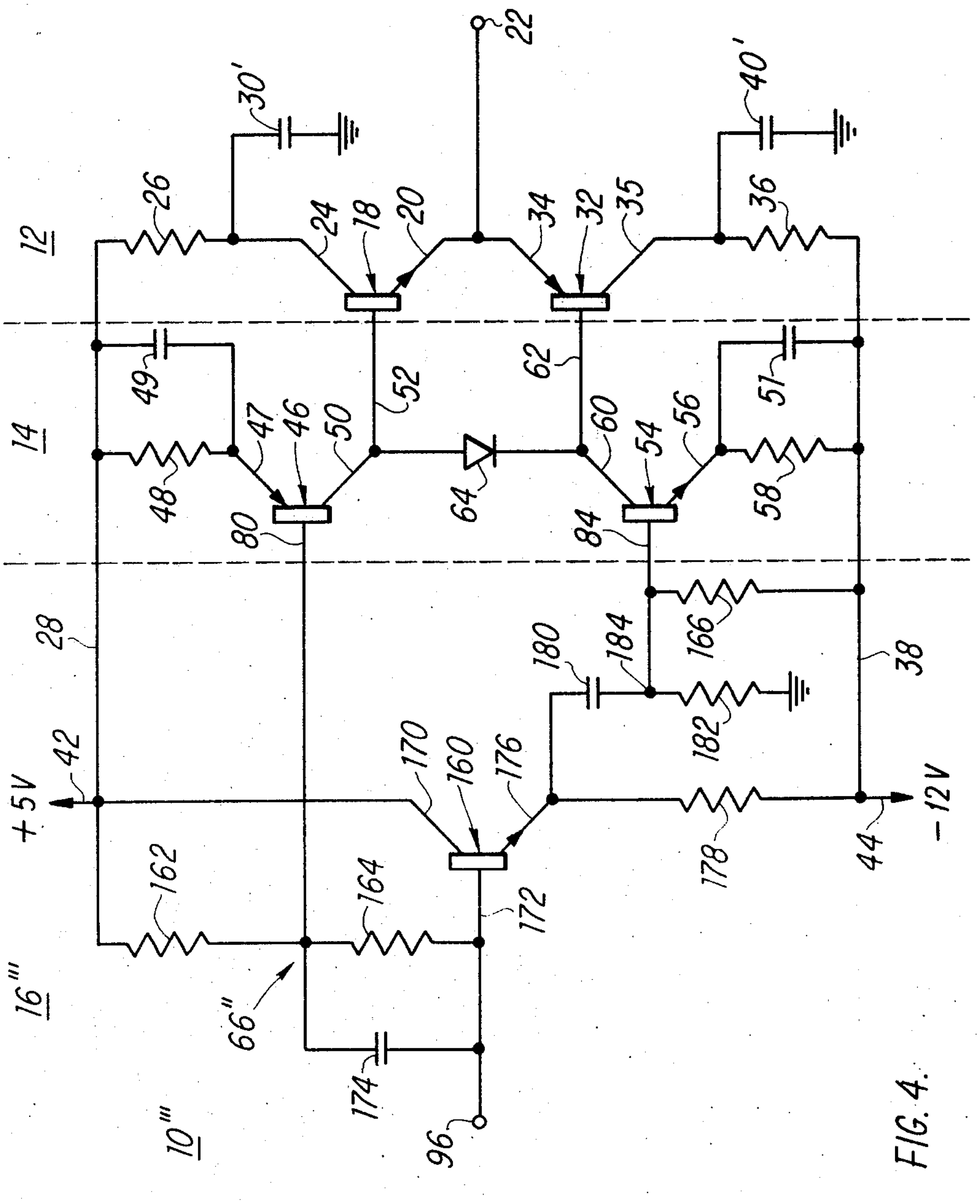
FIG. 4 is a schematic diagram of a switch driver similar to that shown in FIG. 3 modified to operate with a power supply voltage which is close to that of an input signal.

If it is desirable to operate the inverting, high speed, impedance sensitive, amplifying, switch driver similar to that shown in FIG. 3 at a lower voltage level closer to the level of the input signal such as was the case with respect to FIG. 1 this may be accomplished using a switch driver 10''', FIG. 4, having a matching transistor 160 in voltage divider 66''. In FIG. 4 like parts have been given like numbers and similar parts have been given like numbers primed with respect to previous figures. Stages 12 and 14 are identical with those in previous figures. Stage 16''' includes voltage divider 66'' including a transistor 160 and resistors 162, 164, and 166. Collector 170 of transistor 160 is connected directly to positive bus 28. Base 172 of transistor 160 is connected to input 96 and a capacitor 174 is connected between input 96 and base 80 of transistor 46. Emitter 176 of transistor 160 is connected through resistor 178 to negative bus 38 and through capacitor 180 and resistor 182 to ground. Base 84 of transistor 54 is connected to resistor 166 and the junction 184 of capacitor 180 and resistor 182. Capacitors 30' and 40' are similar to capacitors 30 and 40 in FIG. 1 with the exception that one end of each is connected to ground instead of to their respective power buses 28 and 38 as shown in FIG. 1.

In operation with a +5 volt signal at input 96 transistor 54 will conduct more heavily and transistor 46 less heavily requiring transistor 54 to draw additional current through the voltage divider 66'' and more specifically from the combination of resistors 178 and 182. With a zero volt signal at input 96 transistor 46 conducts more heavily and transistor 54 conducts less heavily, causing the excess current in the emitter 47 of transistor 46 to be directed through base 80. Capacitors 174 and 180 perform the same function as capacitors 152 and 154 in FIG. 3. Transistor 160 functions to provide a current when a +5 volt signal is applied to the input and as shown in FIG. 4 the positive power bus 28 is connected to a +5 volt power supply at terminal 42. Without transistor 160 capacitor 180 would significantly load the input 96 during the time the input switches from a low impedance to a high impedance state. However, with the introduction of transistor 160 the current required by capacitor 180 is permitted to flow from the collector 170 to emitter 176 circuit of transistor 160 even when the power supply voltage closely approximates or equals that of the signal voltage.

Other embodiments will occur to those skilled in the art and are within the following claims:

What is claimed is:

1. A high speed, impedance sensitive, amplifying switch driver comprising:

an input terminal for selectively receiving a first input signal of a first voltage accompanied by a high impedance state and a second input signal of a second voltage accompanied by a low impedance state;

an output terminal for presenting first and second high speed amplified switching signals corresponding to said input signals;

an output stage including first and second semiconductor means each having a first load electrode connected to said output terminal for alternately, selectively producing said first and second switching signals;

an intermediate switching stage including third and fourth semiconductor means each having a first load electrode connected in common to the control electrodes of said first and second semiconductor means, for alternately, selectively driving said first and second semiconductor means;

an input stage including means for alternately, selectively biasing one of said third and fourth semiconductor means in a low conduction state and the other in a high conduction state in response to said first and second input signals, said means for biasing including voltage divider means having a first tap connected to the control electrode of said third semiconductor means and a second tap connected with the control electrode of said fourth semiconductor means, and seventh semiconductor means having its control electrode connected to said input terminal and with said first tap and its first load electrode connected to said second tap, said control electrode of said seventh semiconductor means being connected to said first tap through a resistor and said second tap being connected to said control electrode of said fourth semiconductor means through a capacitor.

2. A high speed, impedance sensitive amplifying switch driver circuit comprising:

an output terminal and an output stage including first and second complementary transistors with their emitter electrodes connected together and to said output terminal and their collector electrodes connected one to a positive power supply terminal, the other to a negative power supply terminal;

an intermediate stage including third and fourth complementary transistors operating in their linear regions and having their collector electrodes connected respectively to the base electrodes of said first and second transistors, each of said third and fourth transistors being alternately in a state of conducting more and conducting less, the one of said third and fourth transistors which is conducting more acting to dissipate the stray capacitance associated with each of those transistors;

an input terminal and a first voltage divider including a first part having a first resistor in series between one power supply terminal and the emitter of said third transistor and a second resistor connected between said first resistor and the emitter of a fifth transistor and a second part having a third resistor connected in series between the other power supply terminal and the emitter of said fourth transistor and a fourth resistor connected between said third resistor and the emitter of a sixth transistor; said fifth and sixth transistors each have their base electrodes connected to said input terminal; and a first capacitor interconnected between said emitter of said third transistor and said emitter of said sixth transistor and a second capacitor interconnected between said emitter of said fourth transistor and said emitter of said fifth transistor.

3. The high speed, impedance sensitive amplifying switch driver circuit of claim 2 further including a second voltage divider network interconnected between said power supply terminals and having a first tap connected to the base electrode of said third transistor and a second tap connected to the base electrode of said fourth transistor.

4. A high speed, impedance sensitive amplifying switch driver circuit comprising:

an output terminal and an output stage including first and second complementary transistors with their emitter electrodes connected together and to said output terminal and their collector electrodes connected one to a positive power supply terminal, the other to a negative power supply terminal;

an intermediate stage including third and fourth complementary transistors operating in their linear regions and having their collector electrodes connected to the base electrodes of said first and second transistors, respectively, each of said third and fourth transistors alternately in a state of conducting more and conducting less, the one of said third and fourth transistors which is conducting more acting to dissipate the stray capacitance associated with each of those transistors; and an input terminal and a first voltage divider network extending from one of the power supply terminals to said input terminal and having a first tap connected with the base electrode of said third transistor, said input terminal being coupled through said voltage divider network to said base electrode of said third transistor for varying the bias on said base electrode of said third transistor as a function of a change in impedance at said input terminal, the base electrode of said fourth transistor being connected through a bias resistor to the other power supply terminal and through a capacitor to the emitter of a buffer transistor having its collector connected to the said one power supply terminal and its base electrode directly connected to said input terminal, said circuit being connected in an open loop configuration in which said intermediate stage isolates said output stage from said input stage.

* * * * *